United States Patent
Rostami

(10) Patent No.: US 9,900,998 B2
(45) Date of Patent: *Feb. 20, 2018

(54) ELECTRONIC DEVICE MULTICOMPONENT CASE WITH ELECTRICAL ENERGY STORAGE

(71) Applicant: Advanced Wireless Innovations LLC, Santa Monica, CA (US)

(72) Inventor: Ramin Rostami, Calabasas, CA (US)

(73) Assignee: Advanced Wireless Innovations LLC, Santa Monica, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/302,962

(22) PCT Filed: Aug. 20, 2014

(86) PCT No.: PCT/US2014/051961
§ 371 (c)(1),
(2) Date: Oct. 7, 2016

(87) PCT Pub. No.: WO2015/156836
PCT Pub. Date: Oct. 15, 2015

(65) Prior Publication Data
US 2017/0034932 A1    Feb. 2, 2017

Related U.S. Application Data

(60) Provisional application No. 61/978,188, filed on Apr. 10, 2014.

(51) Int. Cl.
*H04B 1/38* (2015.01)
*H05K 5/00* (2006.01)
*H02J 7/00* (2006.01)
*H04M 1/18* (2006.01)
*H04B 1/3883* (2015.01)
*H04B 1/3888* (2015.01)
(Continued)

(52) U.S. Cl.
CPC .......... *H05K 5/0086* (2013.01); *H02J 7/0042* (2013.01); *H02J 7/0045* (2013.01); *H04B 1/3883* (2013.01); *H04B 1/3888* (2013.01); *H04M 1/185* (2013.01); *H05K 5/0017* (2013.01); *H05K 5/0247* (2013.01); *H05K 5/03* (2013.01)

(58) Field of Classification Search
CPC .......... H04M 1/72575; H04M 1/0262; H04M 1/185; H04M 1/72527; H04M 2001/0204; H02J 50/10; H02J 7/0044; H02J 7/025; H02J 17/00; H04B 1/3883; H04B 1/3888; H05K 5/0017; H05K 5/0086; H05K 5/026

See application file for complete search history.

(56) References Cited

U.S. PATENT DOCUMENTS

| | | |
|---|---|---|
| 6,184,654 B1 | 2/2001 | Bachner, III et al. |
| 2009/0102416 A1 | 4/2009 | Burley |
| 2010/0124040 A1 | 5/2010 | Diebel et al. |

(Continued)

*Primary Examiner* — Xin Jia
(74) *Attorney, Agent, or Firm* — Mintz Levin Cohn Ferris Glovsky and Popeo, P.C.

(57) ABSTRACT

A system, topology, and methods including a multicomponent case for an electronic device, one component including an electrical energy storage element and being slidably removable from another component. Other embodiments may be described and claimed.

18 Claims, 19 Drawing Sheets

(51) Int. Cl.
  *H05K 5/02*  (2006.01)
  *H05K 5/03*  (2006.01)

(56) References Cited

U.S. PATENT DOCUMENTS

2012/0306431 A1    12/2012  Li et al.
2012/0329532 A1    12/2012  Ko
2013/0313252 A1    11/2013  Chan
2014/0035511 A1     2/2014  Ferber et al.
2014/0091689 A1     4/2014  Mishan et al.
2017/0041443 A1*    2/2017  Rostami ............ H04M 1/72575

* cited by examiner

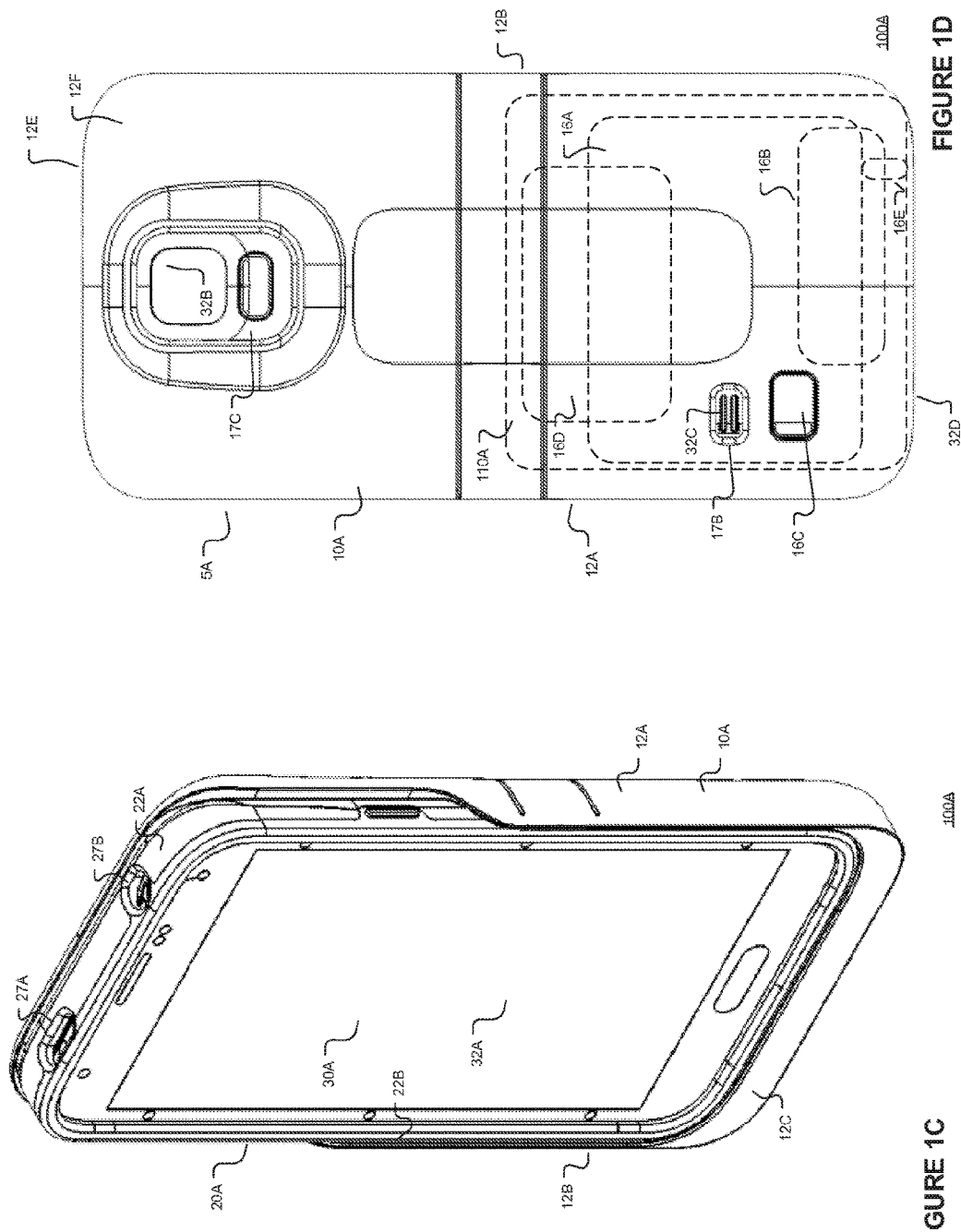

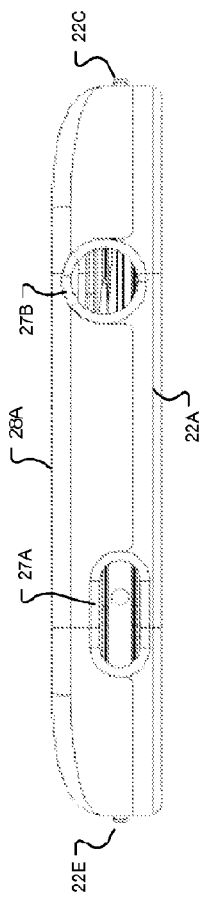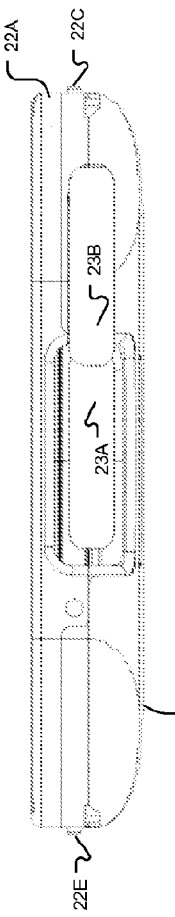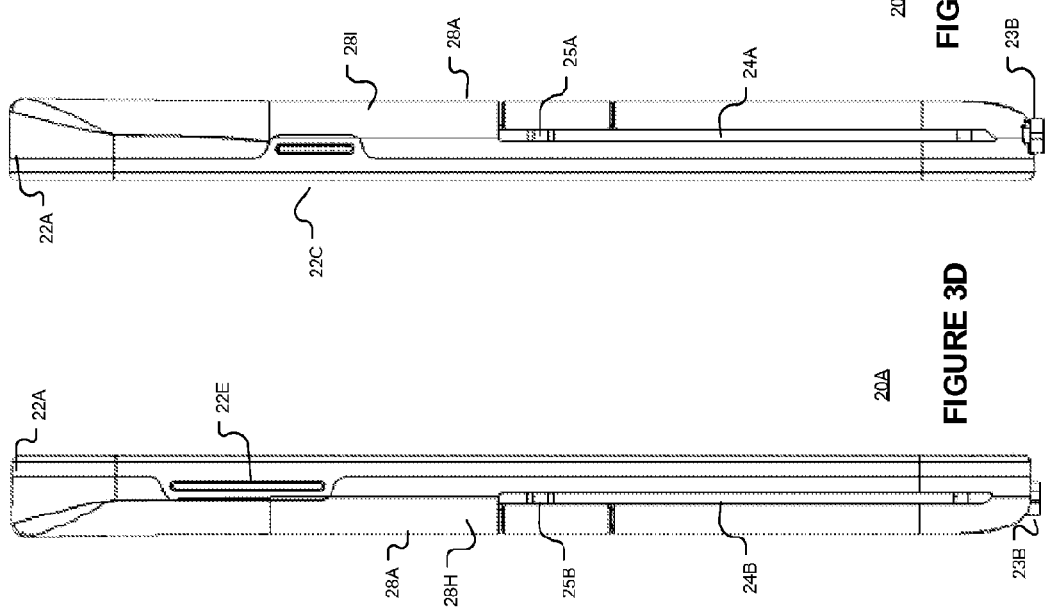

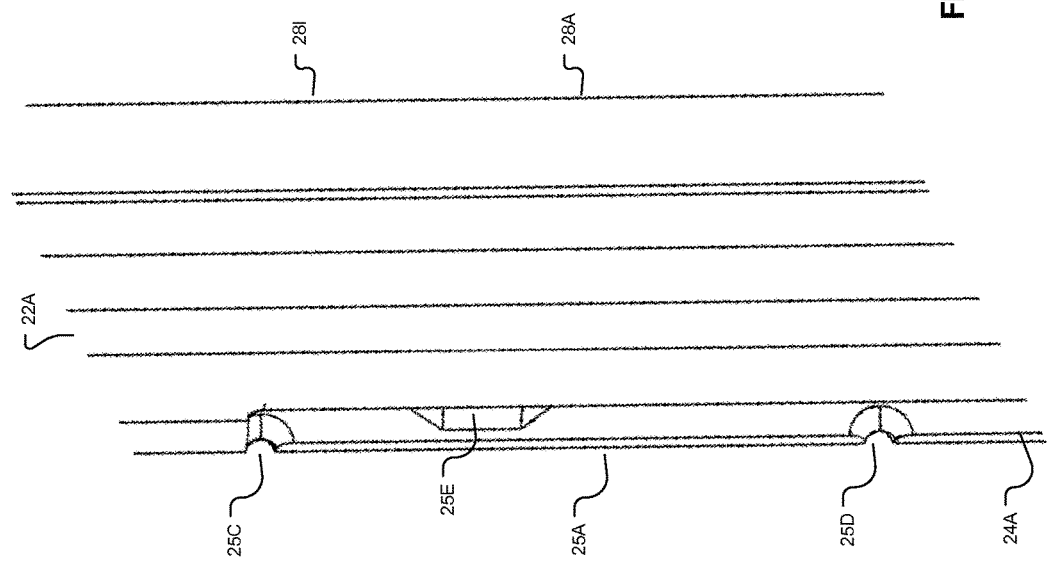
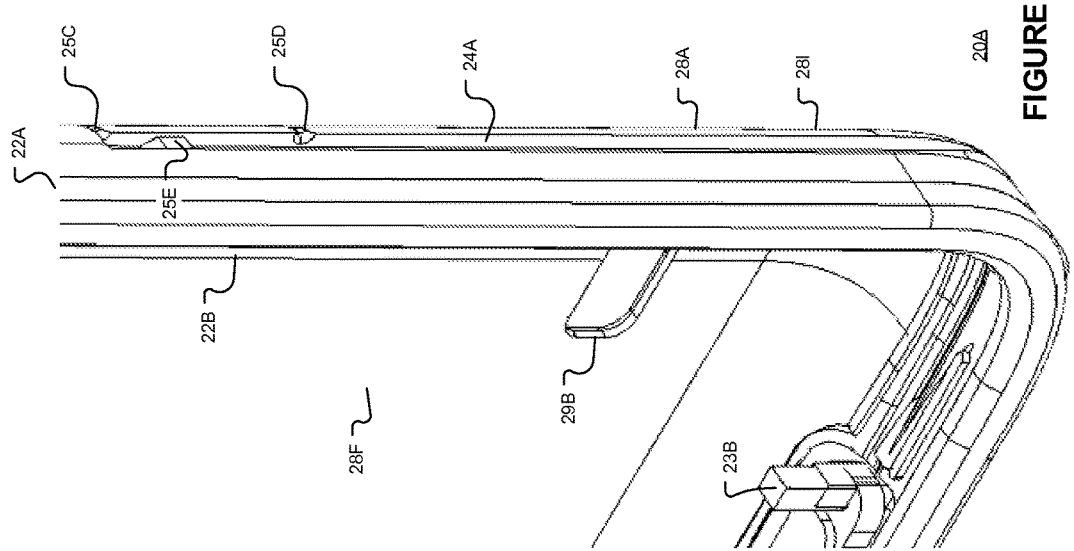

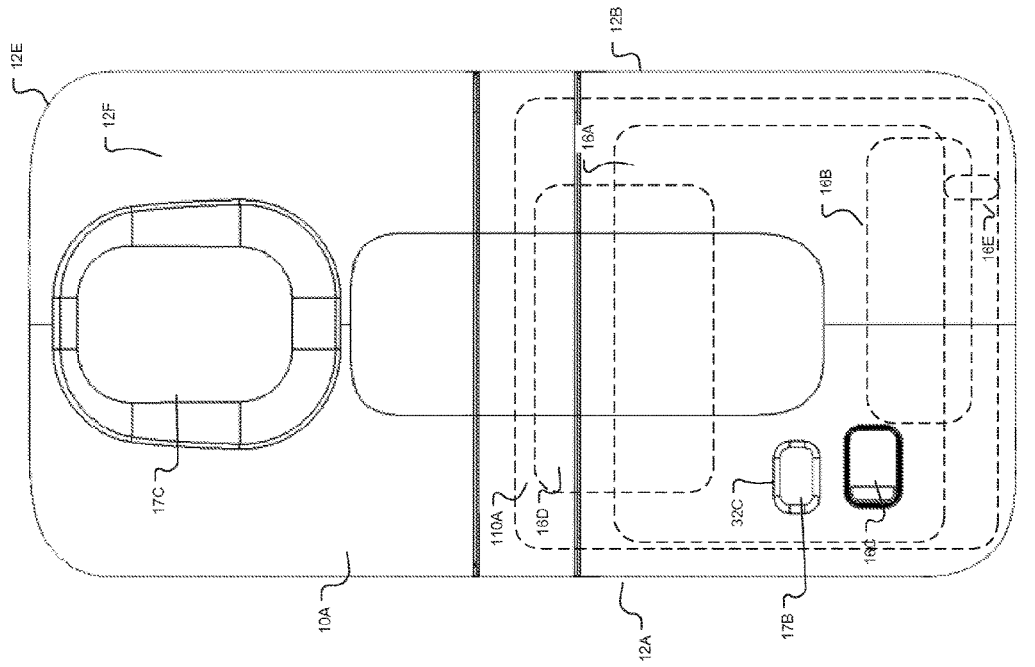

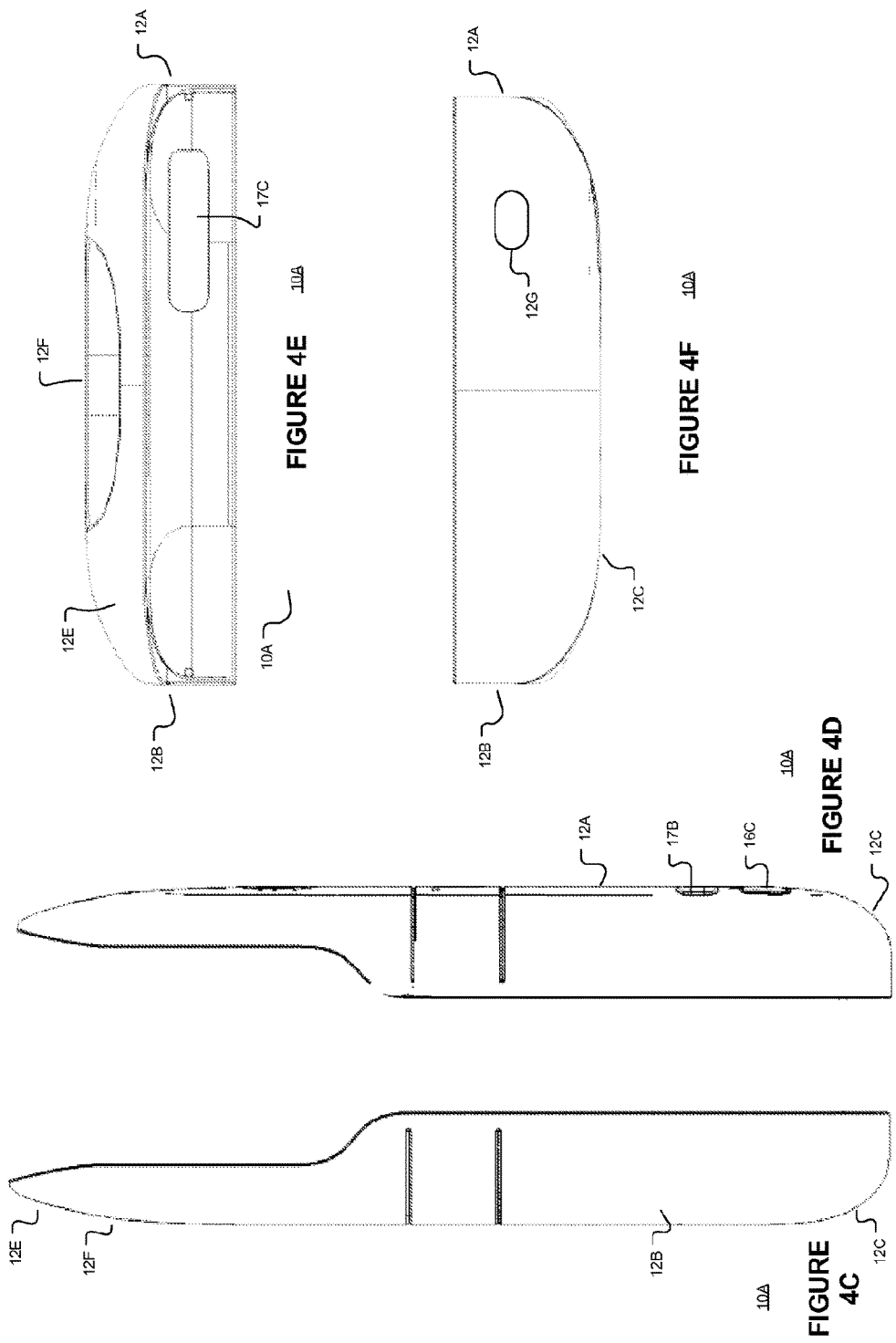

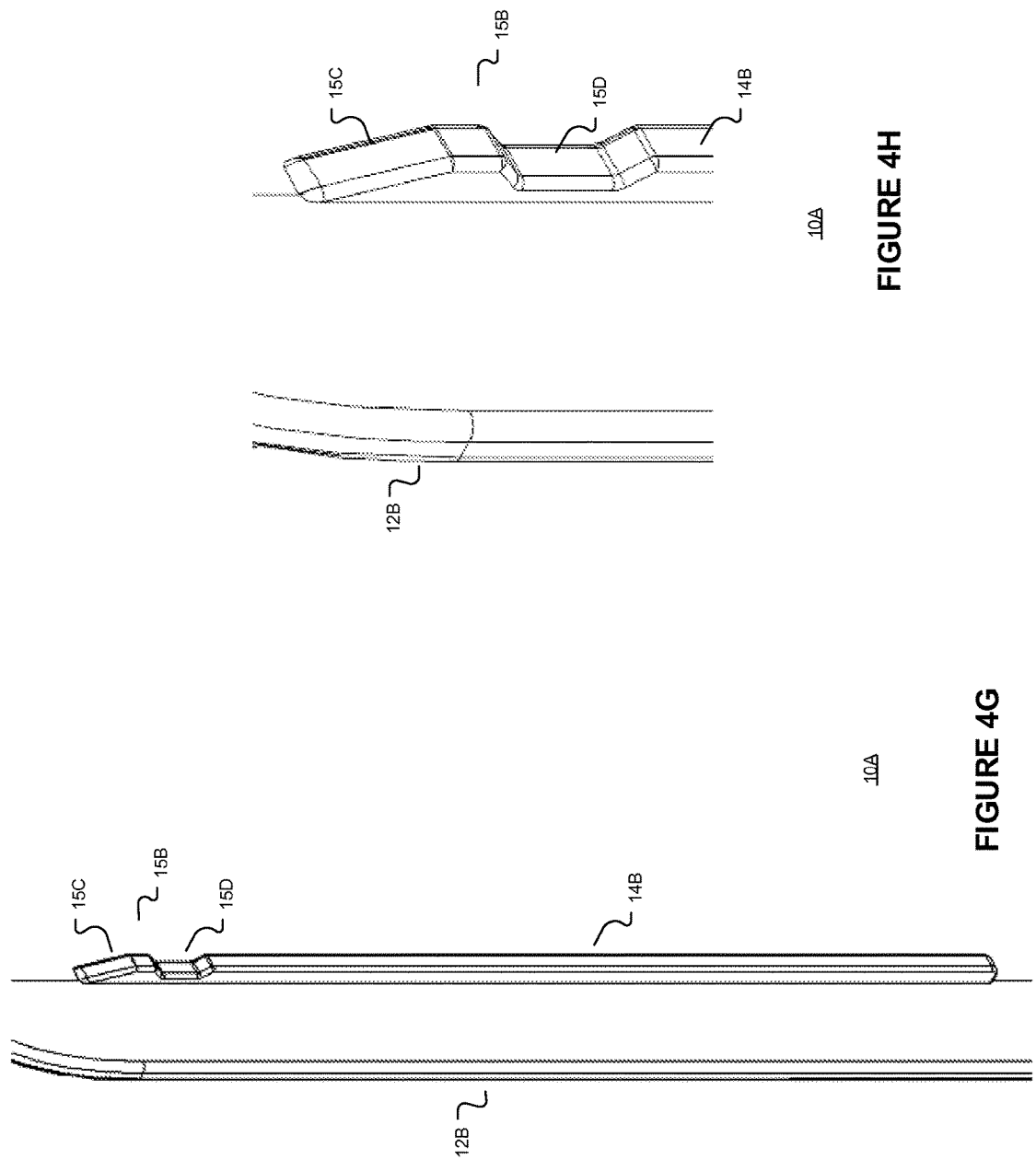

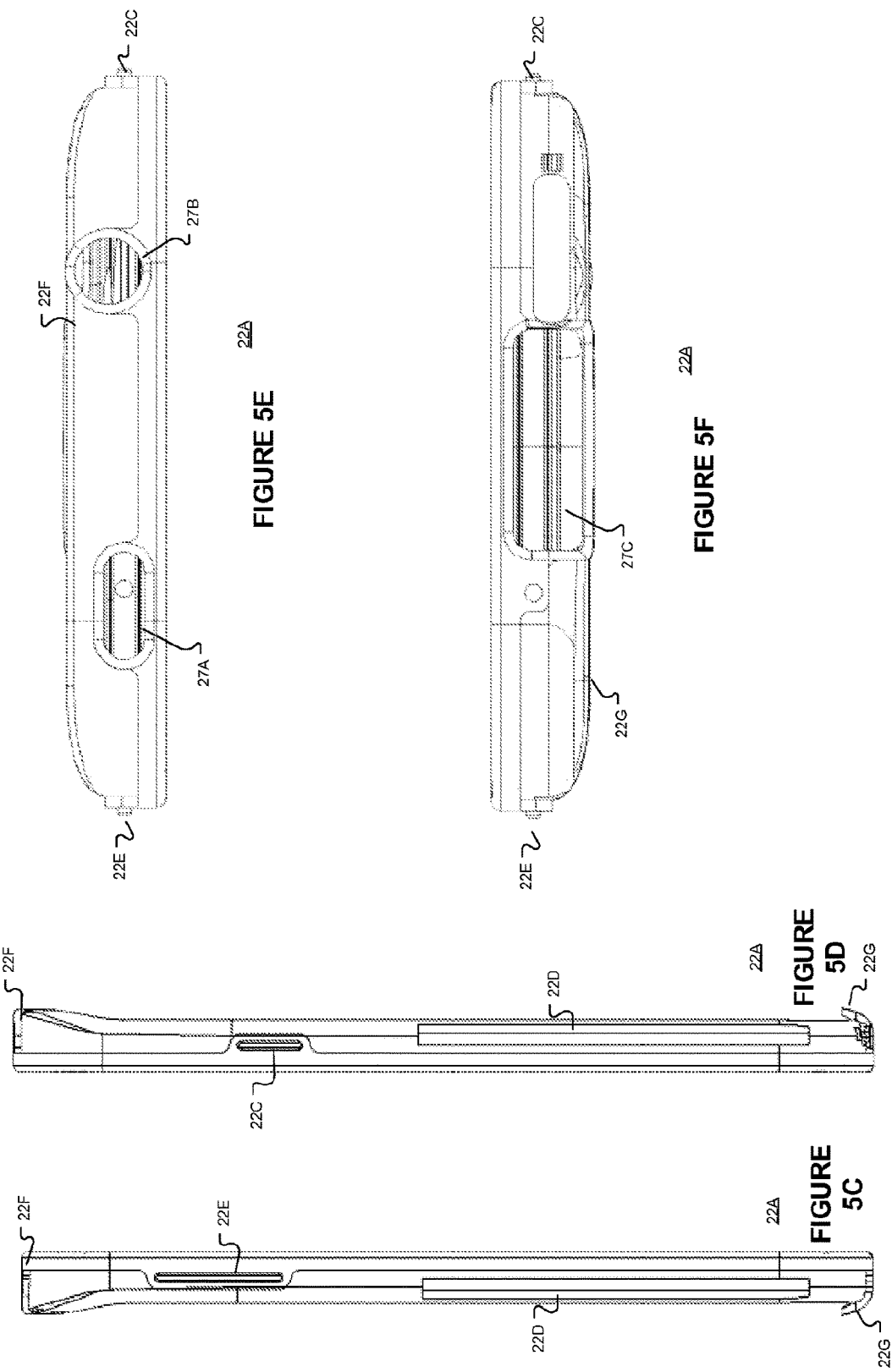

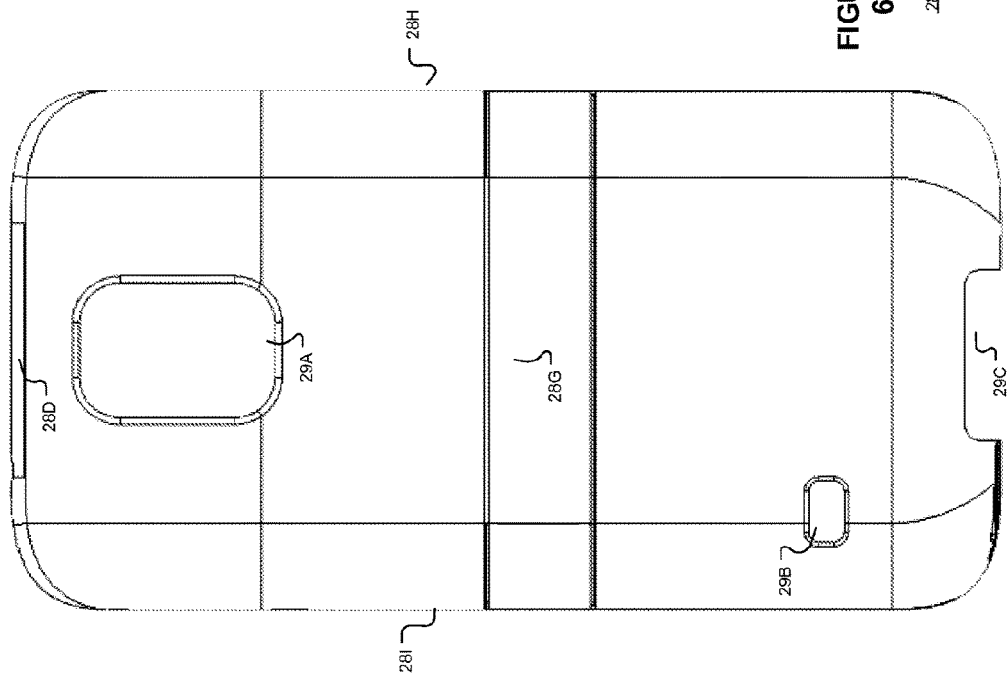
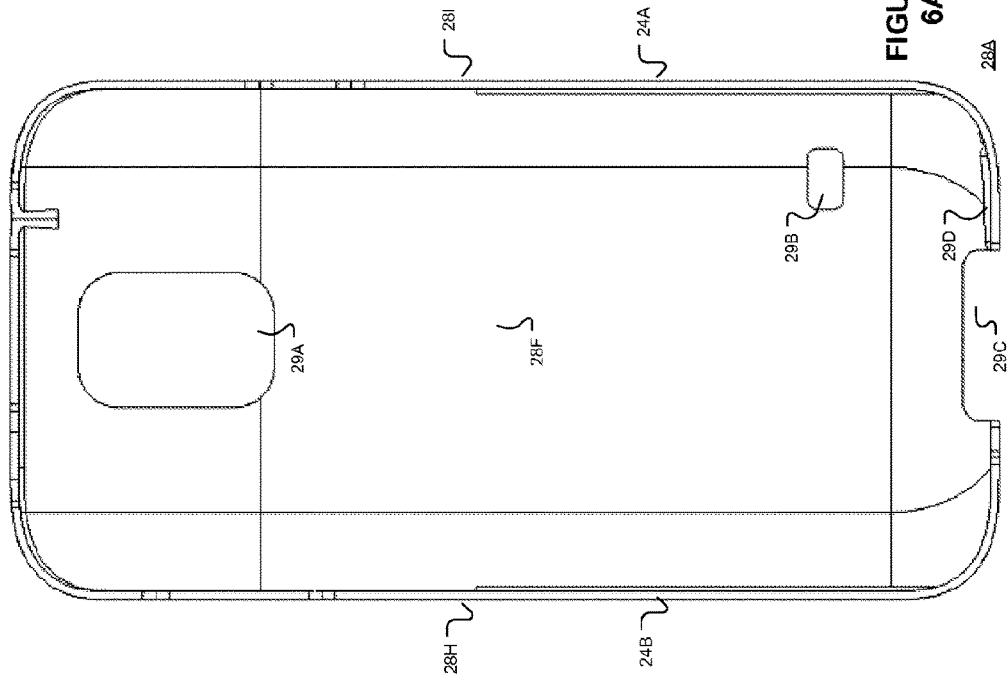

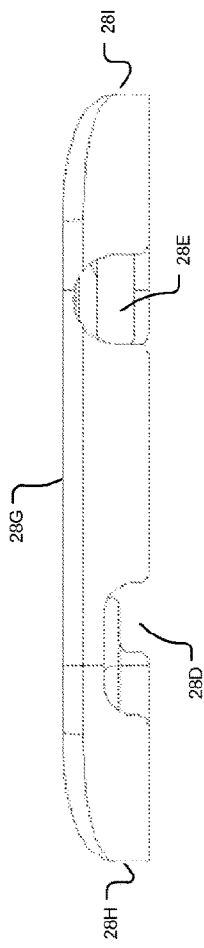
FIGURE 6E
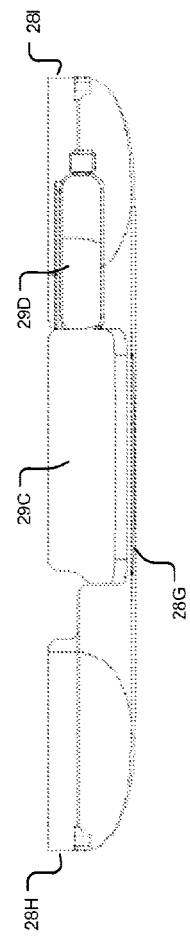
FIGURE 6F
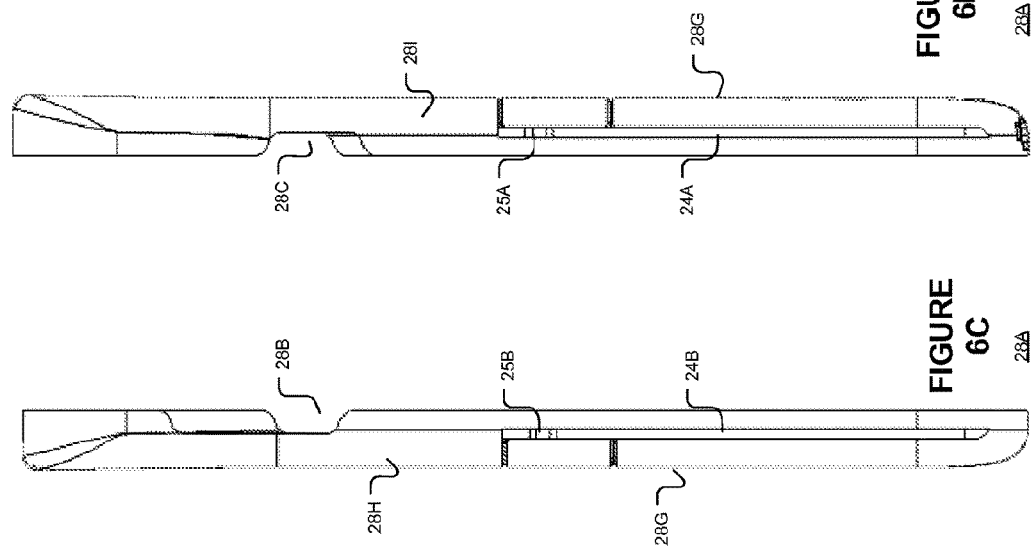
FIGURE 6D
FIGURE 6C

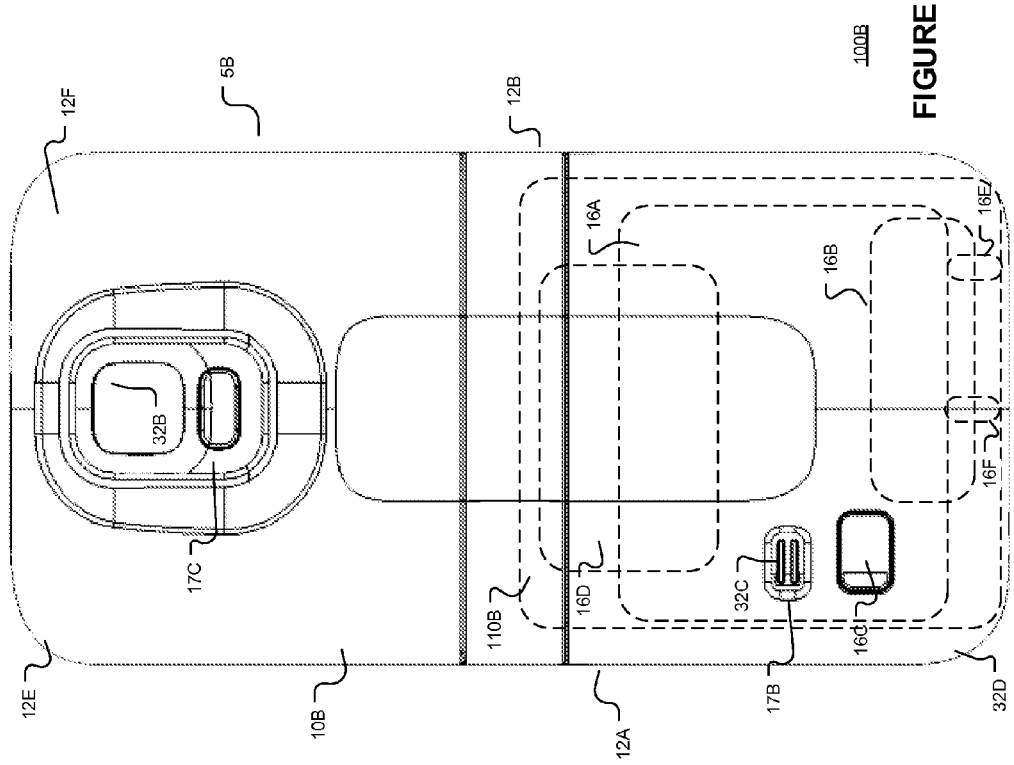

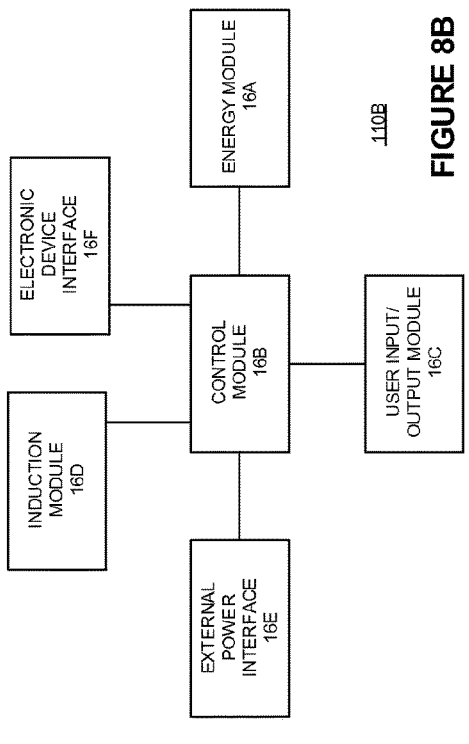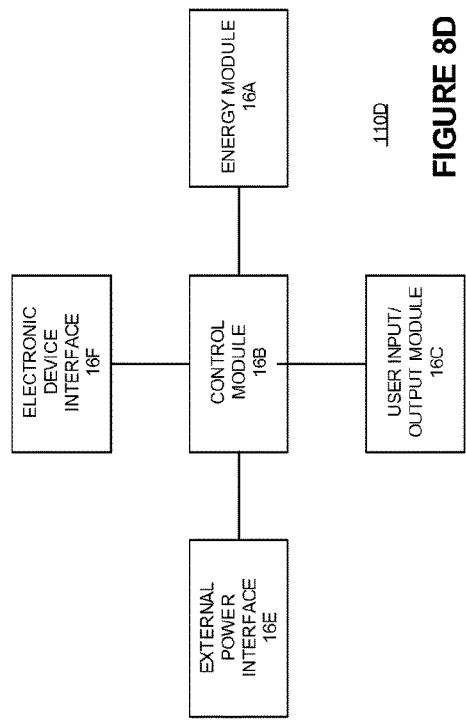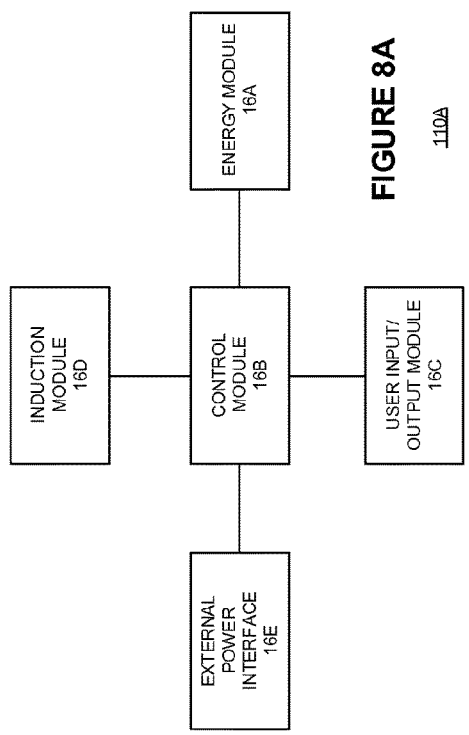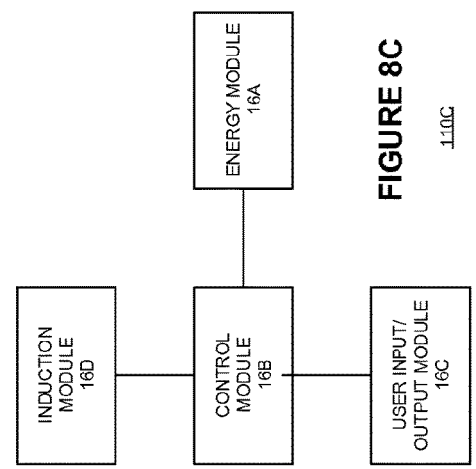

ELECTRONIC DEVICE MULTICOMPONENT CASE WITH ELECTRICAL ENERGY STORAGE

CROSS-REFERENCE TO RELATED APPLICATION

This application is a national-phase entry of Patent Cooperation Treaty Application No. PCT/US2014/051961, which has an international filing date of Aug. 20, 2014, and claims the benefit of U.S. Provisional Patent Application Ser. No. 61/978,188, filed Apr. 10, 2014, which are incorporated by reference herein in their entirety.

TECHNICAL FIELD

Various embodiments described herein relate to electronic device case apparatus and system, in particular case apparatus and systems including an electrical energy storage element and providing electrical energy to a coupled electronic device from the electrical energy storage element.

BACKGROUND INFORMATION

It may be desirable to place a cover one or more sections of an electronic device to protect or improve handling of an electronic device. It may be further desirable to provide electrical energy from an additional covering apparatus or system as needed. The present invention includes such an apparatus and system.

BRIEF DESCRIPTION OF THE DRAWINGS

FIG. 1C is a simplified isometric diagram of a multicomponent powered case (MPC) with a first component (C1) coupled to an electronic device and fully advanced toward a second, powered component (C2) according to various embodiments.

FIG. 1D is a simplified rear diagram of a multicomponent powered case (MPC) with a first component (C1) coupled to an electronic device and fully advanced toward a second, powered component (C2) according to various embodiments.

FIG. 3D is a simplified left side diagram of a multicomponent powered case (MPC) first component (C1) according to various embodiments.

FIG. 3E is a simplified right side diagram of a multicomponent powered case (MPC) first component (C1) according to various embodiments.

FIG. 3F is a simplified top diagram of a multicomponent powered case (MPC) first component (C1) according to various embodiments.

FIG. 3G is a simplified bottom diagram of a multicomponent powered case (MPC) first component (C1) according to various embodiments.

FIG. 3H is a simplified, enlarged, partial isometric diagram of a multicomponent powered case (MPC) first component (C1) according to various embodiments.

FIG. 3I is a simplified, further enlarged, partial isometric diagram of a multicomponent powered case (MPC) first component (C1) according to various embodiments.

FIG. 4A is a simplified front diagram of a multicomponent powered case (MPC) second, powered component (C2) according to various embodiments.

FIG. 4B is a simplified rear diagram of a multicomponent powered case (MPC) second, powered component (C2) according to various embodiments.

FIG. 4C is a simplified left side diagram of a multicomponent powered case (MPC) second, powered component (C2) according to various embodiments.

FIG. 4D is a simplified right side diagram of a multicomponent powered case (MPC) second, powered component (C2) according to various embodiments.

FIG. 4E is a simplified top diagram of a multicomponent powered case (MPC) second, powered component (C2) according to various embodiments.

FIG. 4F is a simplified bottom diagram of a multicomponent powered case (MPC) second, powered component (C2) according to various embodiments.

FIG. 4G is a simplified, enlarged, partial isometric diagram of a multicomponent powered case (MPC) second, powered component (C2) according to various embodiments.

FIG. 4H is a simplified, further enlarged, partial isometric diagram of a multicomponent powered case (MPC) second, powered component (C2) according to various embodiments.

FIG. 5C is a simplified left side diagram of a multicomponent powered case (MPC) first component (C1) first module according to various embodiments.

FIG. 5D is a simplified right side diagram of a multicomponent powered case (MPC) first component (C1) first module according to various embodiments.

FIG. 5E is a simplified top diagram of a multicomponent powered case (MPC) first component (C1) first module according to various embodiments.

FIG. 5F is a simplified bottom diagram of a multicomponent powered case (MPC) first component (C1) first module according to various embodiments.

FIG. 6A is a simplified front diagram of a multicomponent powered case (MPC) first component (C1) second module according to various embodiments.

FIG. 6B is a simplified rear diagram of a multicomponent powered case (MPC) first component (C1) second module according to various embodiments.

FIG. 6C is a simplified left side diagram of a multicomponent powered case (MPC) first component (C1) second module according to various embodiments.

FIG. 6D is a simplified right side diagram of a multicomponent powered case (MPC) first component (C1) second module according to various embodiments.

FIG. 6E is a simplified top diagram of a multicomponent powered case (MPC) first component (C1) second module according to various embodiments.

FIG. 6F is a simplified bottom diagram of a multicomponent powered case (MPC) first component (C1) second module according to various embodiments.

FIG. 7B is a simplified rear diagram of another multicomponent powered case (MPC) with a first component (C1) coupled to an electronic device and fully advanced toward a second, powered component (C2) according to various embodiments.

FIG. 8A is a simplified block diagram of an induction based power module according to various embodiments.

FIG. 8B is a simplified block diagram of a connector based power module according to various embodiments.

FIG. 8C is a simplified block diagram of an induction-only based power module according to various embodiments.

FIG. 8D is a simplified block diagram of a non-induction based power module according to various embodiments.

DETAILED DESCRIPTION

Figure 1B:
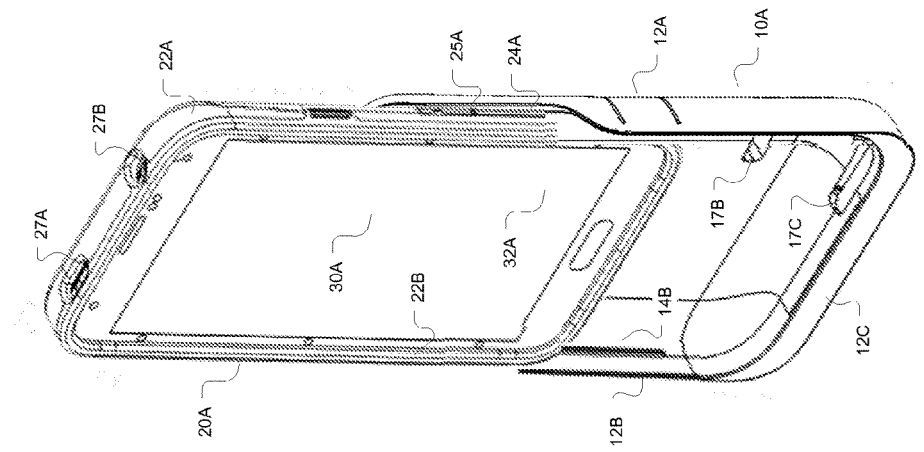
FIG. 1B is a simplified isometric diagram of a multicomponent powered case (MPC) with a first component (C1) coupled to an electronic device and being further advanced toward a second, powered component (C2) according to various embodiments.
Figure 1A:
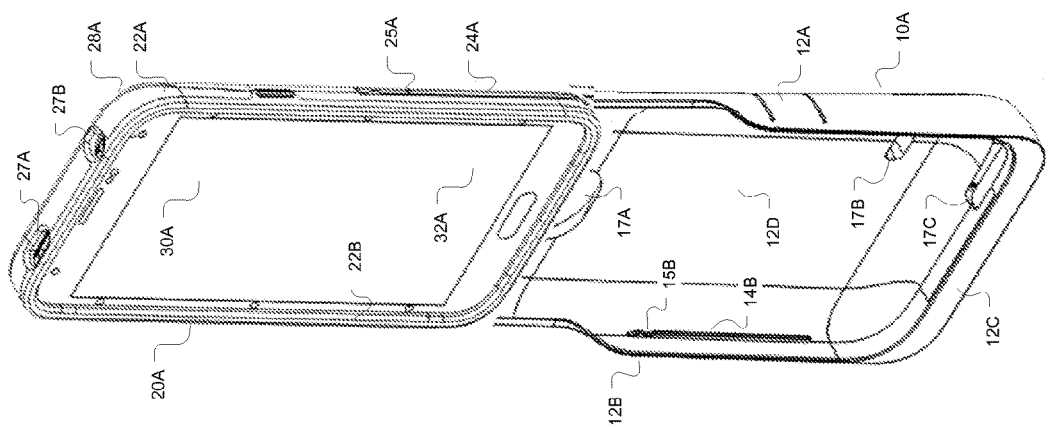
FIG. 1A is a simplified isometric diagram of a multicomponent powered case (MPC) with a first component (C1) coupled to an electronic device and being advancing toward a second, powered component (C2) according to various embodiments.

FIG. 1A is a simplified isometric diagram of architecture 100A including a multicomponent powered case (MPC) system 5A coupled to an electronic device 30A. The MPC system 5 may include a first component (C1) 20A and a second component (C2) 10A. In an embodiment, the first component (C1) 20A may be slidably couplable to the second component (C2) 10A. As shown in FIG. 1A, the C1 20A may be configured to securely encompass a portion of an electronic device 30A. The C2 10A may include a power module 110A, 110B (FIGS. 8A and 8B) that may provide electrical energy to an electronic device 30A when the C1 20A is coupled to the C2 10A.

The MPC system 5A first component (C1) 20A may include rail openings 24A, 24B that are sized and configured to slidably mate with the second component (C2) 10A rails 14A, 14B. The MPC system 5A first component (C1) 20A may include rail extensions 25A, 25B that are sized and configured to slidably mate with the second component (C2) 10A rails depressions 15A, 15B. In an embodiment, the C1 20A may slide downwardly from the C2 10A top edge 12E toward the C2 10A base 12C until the rail extensions 25A, 25B mate with the second component (C2) 10A rails depressions 15A, 15B, providing a resistive force to further movement of the C1 20A relative to the C2 10A downwardly or upwardly along the rails C2 10A rails 14A, 14B.

As shown in FIG. 1A, the MPC system 5A first component (C1) 20A may include an outer perimeter 22A and an inner device mating module shell 28A. The MPC system 5A second component (C2) 10A may include a right shoulder 12A, a left shoulder 12B, a base 12C, inner back 12D, top edge 12E, and an outer back 12F. The second component (C2) 10A right shoulder 12A inner side adjacent the inner back 12D may include the right rail 14A. The second component (C2) 10A left shoulder 12B inner side adjacent the inner back 12D may include the left rail 14B. The second component (C2) 10A may include openings or fenestrations 17A, 17B, 17C that correspond to one or more electronic device 30A components including a camera 32B, a near field communication module 32C, and a speaker 32D. The first component (C1) 20A perimeter 22A may include openings or fenestrations 27A, 27B, 27C that correspond to one or more electronic device 30A components including a headphone jack port 32E, a user control module 32F, and an electronic interface module 32G. The outer per FIG. 1B is a simplified isometric diagram of a multicomponent powered case (MPC) 5A with the first component (C1) 20A coupled to an electronic device and being further advanced toward the second, powered component (C2) 10A according to various embodiments. FIG. 1C is a simplified isometric diagram of a multicomponent powered case (MPC) 5A with a first component (C1) 20A coupled to an electronic device 30A and fully advanced and coupled to a second, powered component (C2) 10A according to various embodiments. As noted, the MPC system 5A first component (C1) 20A may include rail openings 24A, 24B that are sized and configured to slidably mate with the second component (C2) 10A rails 14A, 14B. In an embodiment, the railing openings 24A, 24B and rails 14A, 14B are sized so the C1 20A may slide with a small or little resistance between the components C1 20A, C2 10A.

In an embodiment, a MPC system 5A first component (C1) 20A may further include rail extensions 25A, 25B that are sized and configured to slidably mate with the second component (C2) 10A rails depressions 15A, 15B. In an embodiment, once the C1 20A is further advanced and coupled to the C2 10A as shown in FIG. 1C, the rail extensions 25A, 25B may be adjacent and coupled/mated with the second component (C2) 10A rails depressions 15A, 15B. Such mating between the extensions 25A, 25B and depressions 15A, 15B may provide a resistive force sufficient to prevent the C1 20A from decoupling from the C2 10A unintentionally. The resistive force, however may be overcome by a user intending to separate the components C1 20A, C2 10A by advancing the C1 20A upwardly away from the C2 10A as shown in FIGS. 1A and 1B.

FIG. 1D is a simplified rear diagram of architecture 100A including a multicomponent powered case (MPC) 5A with a first component (C1) 20A coupled to an electronic device 30A and fully advanced and coupled with a second, powered component (C2) 10A according to various embodiments. As shown in FIG. 1D, the C2 10A has a plurality of openings or fenestrations 17A and 17B that may correspond to one or more electronic device 30A components including a camera 32B and a near field communication module 32C. As also shown in FIG. 1D, the second component 10A may include an induction based power module 110A. As shown in FIG. 1D and FIG. 8A, the induction based power module 110A may include an electrical energy storage module 16A, a control module 16B, a user control-display module 16C, an inductive charging module 16D, and an external power interface 16E. The power module 110A may provide power to an electronic device 30A via induction (via the induction module 16D). The power module 110A may receive electrical energy via induction (the induction module 16D) or directly via the external power interface module 16E.

In another embodiment shown in FIG. 8C, a C2 power module 110C may be induction based only. The induction only power module 110C may not include an external power interface 16E. The power module 110C may provide power to an electronic device 30A via induction (via the induction module 16D). The power module 110C may receive electrical energy via induction (the induction module 16D). In a further embodiment shown in FIG. 8B, a power module 110B may include an electronic device interface 16F and an induction module 16D. The power module 110B may provide power to an electronic device 30A via induction or a direct connection (via electronic device interface module 16F). The power module 110B may also receive electrical energy via induction (the induction module 16D) or directly via the external power interface module 16E.

FIG. 8D is a simplified block diagram of a non-induction based power module 110D according to various embodiments. The power module 110D may provide power to an electronic device 30A via a direct connection (via electronic device interface module 16F). The power module 110D may receive electrical energy directly via the external power interface module 16E. In an embodiment a power module's 110A-110D electrical energy storage module 16A may include one or more elements capable of storing and discharging electrical energy. The elements may include batteries, capacitors, or other energy storage devices. The user control-display module 16C may include user one or more input element and one or more output elements. The input elements may include a slidable or depressible element. The output elements may include user detectable devices including light generation or sound generation devices. The light generation devices may include one or more light emitting diodes and color changing devices.

The inductive charging module 16D may include a primary coil that generates a magnetic field. An electronic device 30A may include a complementary secondary coil that may induce a current from the magnetic field. In an embodiment, the inductive charging module 16D may induce an electric current from a magnetic field generated by another induction coil. In such an embodiment, a power module's 110A-C induction module 16D may receive electrical energy from another induction module and provide electrical energy to another induction module. In a power module 110A, 110B, 110D including a external power interface, the power module may receive electrical energy directly from an external. In power modules 110A-D, the received electrical energy may be used to charge or increase storage levels of the energy module 16A. The received electrical energy may be used to provide electrical energy to an electronic device 30A directly or induction.

A user may determine whether a power module 110A-110D provides electrical energy to an electronic device 30A via the user input-output module 16C. A user may also note the operational status of a power module 110A-D via the user input-output module 16C. The output signal may indicate whether a power module 110A-D is receiving electrical energy, discharging electrical energy, and the energy module 16A storage level. The user input-output module 16C may employ one or more light generation modules to provide such indications including color changing modules.

In an embodiment, a power module 110A-D control module 16B may include a printed circuit board (PCB), processor, and application specific integrated circuit (ASIC). A control module 16B based on the user selection via the user input-output module 16C may provide energy to an electronic device 30A. The control module 16B may direct energy from the energy storage module 16A or an external source (via the induction module 16D or external power interface 16E) as a function of the energy level from an external source, the energy storage module 16A level, and user selection. The control module 16B may provide electrical energy to an electronic device 30A via the induction module 16D or electronic device interface 16F as a function of the electronic device 30A and user selection in an embodiment. The electronic device interface 16F may have or conform to a standardized interface including compiling with a universal serial bus (USB) protocol or a device specific interface. Similarly, the external power interface 16E may have or conform to a standardized interface including compiling with a universal serial bus (USB) protocol or a device specific interface.

Figure 1F:
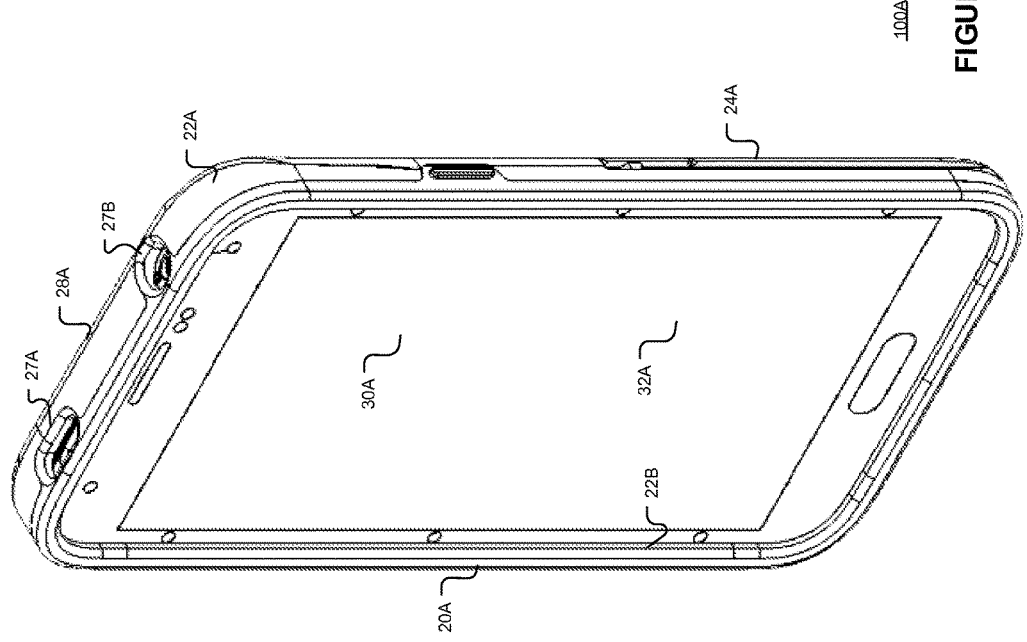
FIG. 1F is a simplified isometric diagram of a multicomponent powered case (MPC) first component (C1) first module and second module coupled to an electronic device according to various embodiments.
Figure 1E:
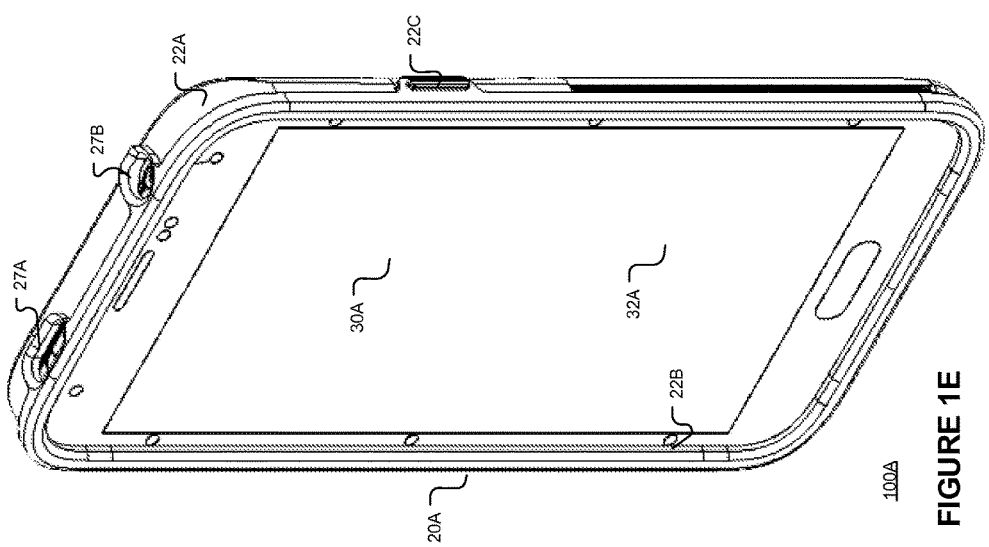
FIG. 1E is a simplified isometric diagram of a multicomponent powered case (MPC) first component (C1) first module coupled to an electronic device according to various embodiments.

FIG. 1E is a simplified isometric diagram of a multicomponent powered case (MPC) 5A first component (C1) first module 22A coupled to an electronic device 30AA according to various embodiments. In an embodiment, a MPC 5A first component C1 20A may include two separable modules 22A and 28A. Module 22A may be a perimeter module and formed of an at least semi-flexible material including an elastomer, polymer, rubber, and silicon. The other C1 20A module 28A may be a rear shell and formed of a more rigid or similar flexible material. In an embodiment, the C1 20A perimeter module 22A may be installed or coupled to an electronic device 30A perimeter. Then the C1 20A rear shell 28A may be coupled to the C1 20A perimeter module 22A and electronic device 30A as shown in FIG. 1F.

In another embodiment, the C1 28A rear shell 28A may be installed, coupled, or held temporarily to an electronic device 30A rear section. Then the C1 20A perimeter module 22A may be coupled to the C1 20A rear shell 28A and electronic device 30A. In a further embodiment, the C1 20A perimeter module 22A and C1 20A rear shell 28A may be coupled together. Then the combined C1 20A modules 22A and 28A may be coupled to the electronic device 30A. In an embodiment, the C1 20A perimeter module 22A and C1 20A rear shell 28A may be fixably coupled together when provided to a user for installation on a user device 30A.

The C1 20A first perimeter module 22A may include an inward lip 22B that is over and covers a portion of the electronic device's 30A face 32A. The C1 20A second, shell module 28A may cover a portion of the electronic device's 30A rear section other than one or more openings 29A, 29B formed to expose one or more electronic device's 30A elements 32B, 32C. The MPC 5A first component C1 20A may cover, protect, and provide ease of handling of an electronic device 30A. When additional support or power is needed for an electronic device 30A, a user may couple the electronic device 30A to the MPC 5A second component 20A via the first component 10A as shown in FIGS. 1A-1C. Upon coupling the first component C1 with the second component C2, the MFC 5A power module 110A-D may automatically provide power to the electronic device 30A via an induction module 16D or electronic device interface 16F. In an embodiment, a user may direct the power module 110A-D via the user input-output module 16C to provide power to the electronic device 30A via an induction module 16D or electronic device interface 16F.

Figure 2A:
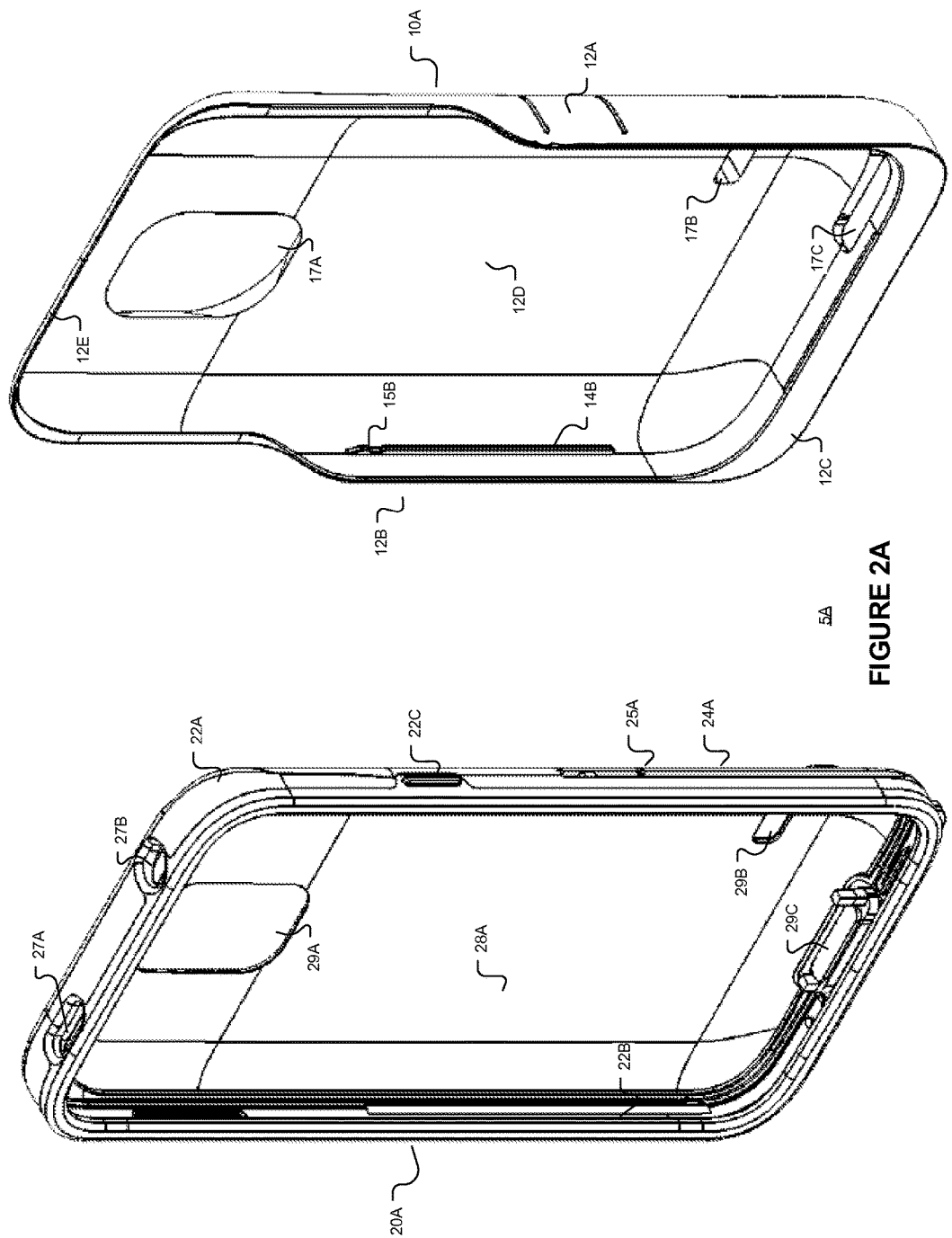
FIG. 2A is a simplified isometric diagram of a multicomponent powered case (MPC) according to various embodiments.

FIG. 2A is a simplified isometric diagram of a multicomponent powered case (MPC) 5A components C1 20A and C2 10A according to various embodiments. The MPC 5A shown in FIG. 2A may include a power module 110A or 110C and not include an electronic device interface 16F. As shown in FIG. 2A, the components C1 20A and C2 10A may openings 29A, 17A and 29B, 17B that are co-aligned when the components C1 20A and C2 10A are fully coupled as shown in FIGS. 1C and 1D. Only the first component C1 20A includes openings 27A and 27B for other electronic device 30A elements since the second component C2 10A does not fully enclose the electronic device 30A perimeter or periphery as shown in FIGS. 1A-1D. In addition, the second component C2 10A sides 12A, 12B do not extend fully along the electronic device 30A sides as shown in FIGS. 1A-1D. Then configuration may enable a user to more easily remove or separate the C1 20A from C2 10A when desired by creating gripping areas on the C1 20A perimeter 22A above the C2 10A arms 12A, 12B.

Figure 2B:
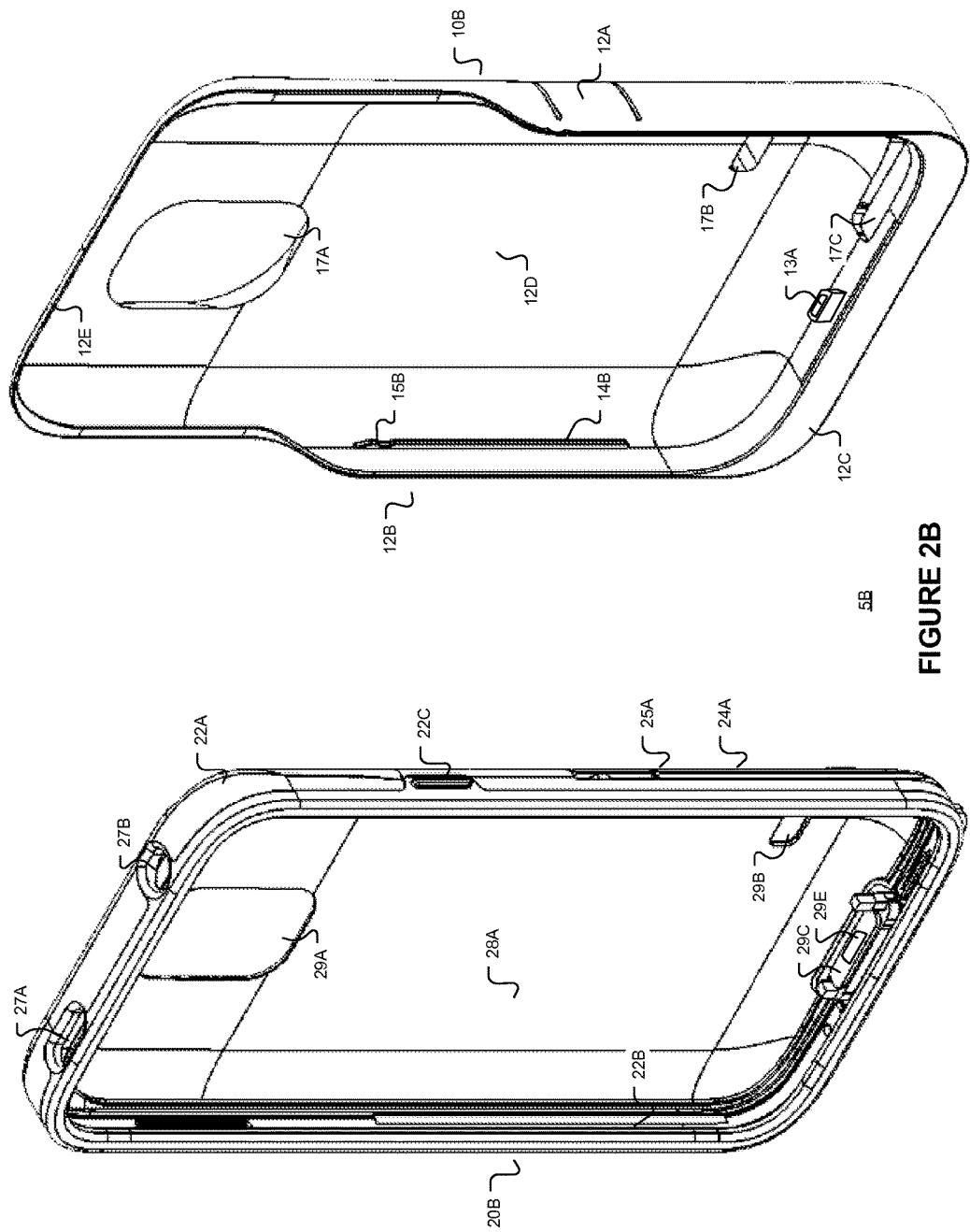
FIG. 2B is a simplified isometric diagram of another multicomponent powered case (MPC) according to various embodiments.

FIG. 2B is a simplified isometric diagram of a multicomponent powered case (MPC) 5B components C1 20B and C2 10B according to various embodiments. The MPC 5B shown in FIG. 2B may include a power module 110B or 110D and include an electronic device interface 16F. The component C2 10B may include an electronic device connector 13A as shown in FIG. 2B. The connector 13A may be placed to align a corresponding electronic 30A electronic interface module 32G. The connector 13A may be electrically coupled to a power module 110B, 110D electronic device interface 16F. The MPC 5B first component C1 10B may include an opening 29E that is co-aligned with the C2 20B connector 13A. The opening 29E may enable the connector 13A to extend through the C1 10B to an electronic device 30A interface 32G when the C1 10B is fully coupled to the C2 20B and an electronic device 30A is coupled to the C1 20B.

Figure 3A:
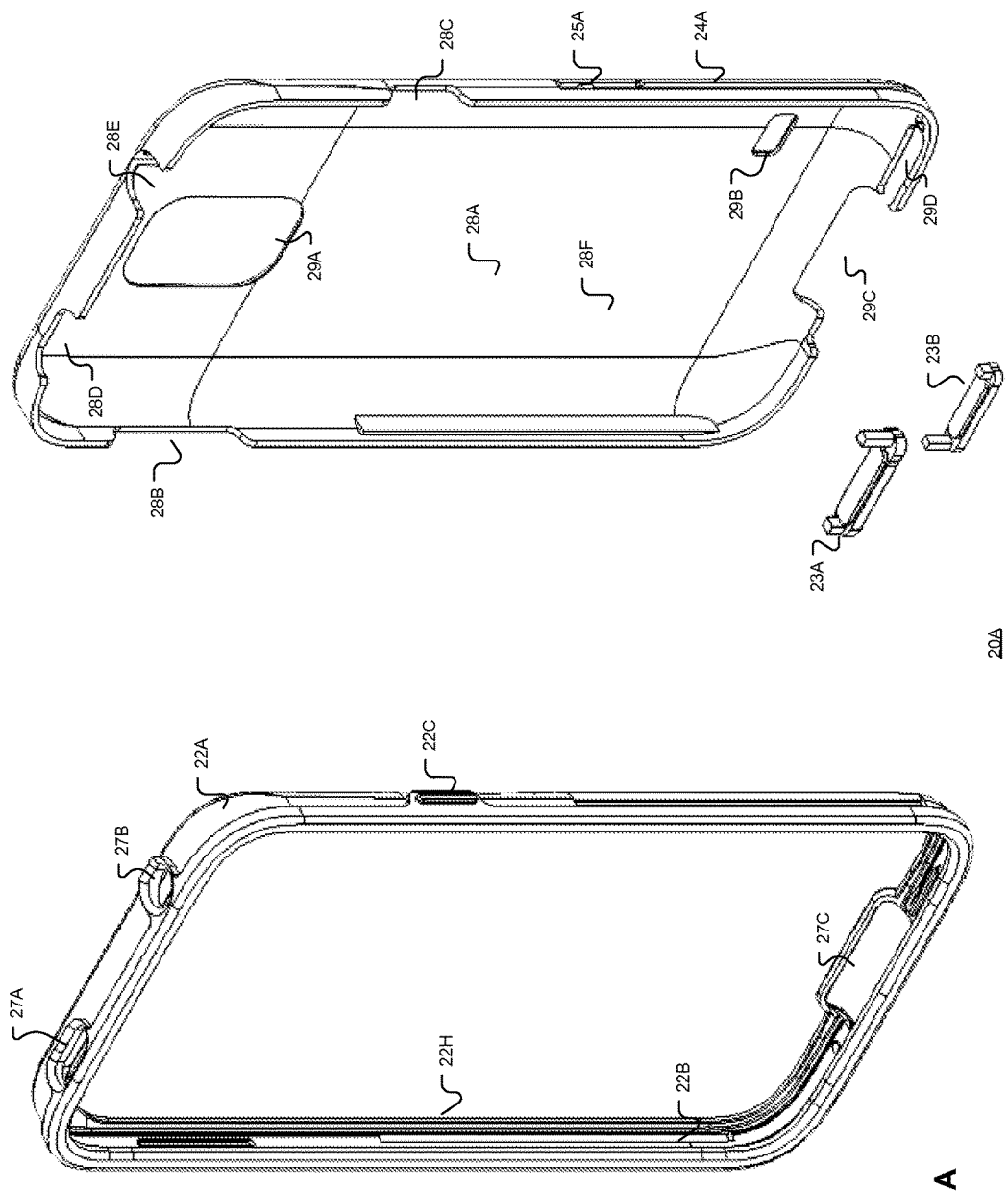
FIG. 3A is a simplified, expanded, isometric diagram of a multicomponent powered case (MPC) first component (C1) modules according to various embodiments.

FIG. 3A is a simplified, expanded, isometric diagram of a multicomponent powered case (MPC) 5A first component (C1) 20A modules 22A and 28A according to various embodiments. As shown in FIG. 3A, the C1 20A module 22A may include a front lip 22B, a first electronic device button extension 22C, a rear extension 22H, an upper, left opening 27A, an upper, right opening 27B, and a lower, middle opening 27C. The C1 20A module 28A may include a left side upper, button opening 28B, a right side, upper button opening 28C, rail depression 24A, rail extension 25A, upper rear opening 29A in the inner back 28F, lower, right opening 29B, bottom middle opening 29C, bottom right opening 29D, first nestable cover section 23A and second nestable cover section 23B. The first cover section 23A may be sized and shaped to engage the openings 29C and 27C. The second cover section 23B may be sized and shaped to engage the opening 29D. The module 22A rear extension 22H may conform and engage the module 28A outer back 28G. The button covers 22C (and 22E shown in FIG. 3D) may be co-aligned with module 28A button openings 28C, 28B, respectively when the module 28A is coupled to the module 22A (see FIG. 2A). Similarly, the opening 27C may be co-aligned with the opening 29C when the module 28A is coupled to the module 22A.

Figure 3C:
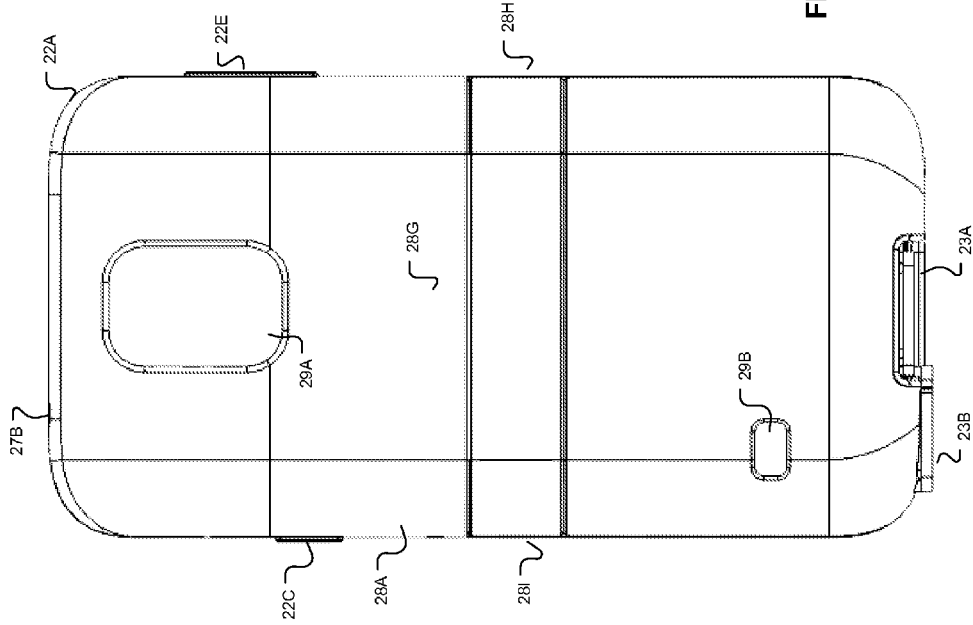
FIG. 3C is a simplified rear diagram of a multicomponent powered case (MPC) first component (C1) according to various embodiments.
Figure 3B:
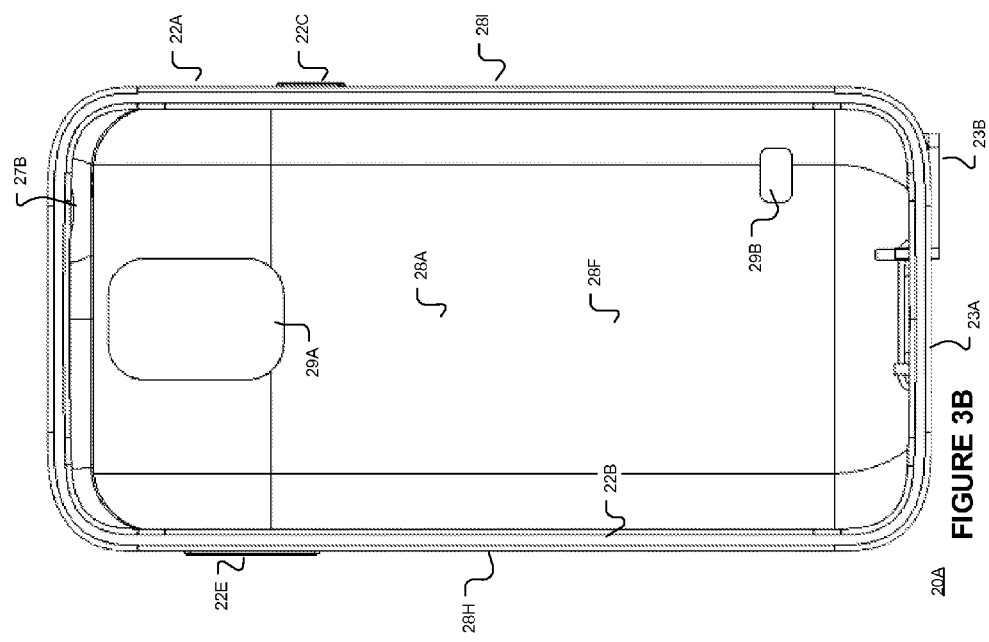
FIG. 3B is a simplified front diagram of a multicomponent powered case (MPC) first component (C1) according to various embodiments.

FIG. 3B is a simplified front diagram and FIG. 3C is a simplified rear diagram of a multicomponent powered case (MPC) 5A first component (C1) 20A according to various embodiments. As shown in FIGS. 3B and 3C, the C1 20A may have an inner back 28F, outer back 28G, a left side 28H, a right side 28I, a left side, upper button extension 22E, a right side, upper button extension 22C, device element openings 29A and 29B, and nestable cover sections 23A and 23B. FIG. 3D is a simplified left side diagram and FIG. 3E is a simplified right side diagram of a multicomponent powered case (MPC) 5A first component (C1) 20A according to various embodiments. As shown in FIGS. 3D and 3E, the C1 20A may include a rail depression 24A and a rail extension 25A on the right side 28I and a rail depression 24B and a rail extension 25B on the left side 28H. FIG. 3F is a simplified top diagram and FIG. 3G is a simplified bottom diagram of a multicomponent powered case (MPC) 5A first component (C1) 20A according to various embodiments. As shown in FIGS. 3F and 3G, the device button extensions 22C and 22E may extend beyond the sides 28H, 28I. Such extensions may enable a user to tactically locate the buttons.

FIG. 3H is a simplified, enlarged, partial isometric diagram and FIG. 3I is a simplified, further enlarged, partial isometric diagram of a multicomponent powered case (MPC) 5A first component (C1) 20A according to various embodiments. As shown in FIGS. 3H and 3I, a rail extension 25A may include an upper rail indentation 25C, a lower rail indentation 25D, and a hollowed, compressible section 25E. The rail extension 25A elements 25C, 25D, and 25E may enable the corresponding rail notch 15A (FIG. 4A) to compress and nest with the rail extension 25A.

FIG. 4A is a simplified front diagram and FIG. 4B is a simplified rear diagram of a multicomponent powered case (MPC) 5A second, powered component (C2) 10A according to various embodiments. As shown in FIGS. 4A and 4B the MPC 5A C2 10A may include a right shoulder 12A, a left shoulder 12B, a base 12C, an inner, back 12D, an outer, back 12F, a top edge 12E, a left rail 14B, a left rail notch 15B, a right rail 14A, a right rail notch 15A, a power module 110A, and device openings 17A, 17B, 17C. FIG. 4C is a simplified left side diagram and FIG. 4D is a simplified right side diagram of a multicomponent powered case (MPC) 5A second, powered component (C2) 10A according to various embodiments. As shown in FIGS. 4C and 4D, the right shoulder 12A and the left shoulder 12B reduce inwardly to the outer, back 12F at the top 12E. As noted, the shoulder reductions may expose upper, side sections of the MPC 5A C1 20A.

FIG. 4E is a simplified top diagram and FIG. 4F is a simplified bottom diagram of a multicomponent powered case (MPC) 5A second, powered component (C2) 10A according to various embodiments. As shown in FIG. 4F, the C2 10A base 12C may include an opening 12G that enables a connector to couple to a power module 110A, 110B, and 110D external power interface 16E. FIG. 4G is a simplified, enlarged, partial isometric diagram and FIG. 4H is a simplified, further enlarged, partial isometric diagram of a multicomponent powered case (MPC) 5A second, powered component (C2) 10A according to various embodiments. As shown in FIGS. 4G and 4H, a rail 14B notch 15B may include a sloped rail entrance 15C and a rail indention 15D. The sloped rail entrance 15C may ease a rail 14A, 14B into a corresponding rail insert 24A, 24B.

Figure 5B:
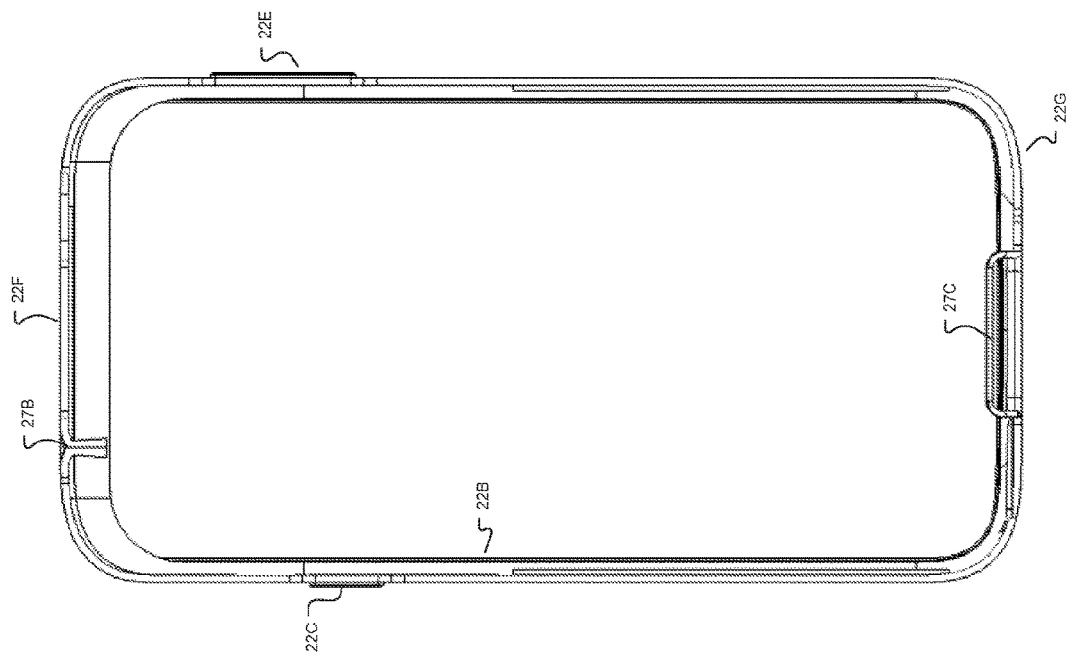
FIG. 5B is a simplified rear diagram of a multicomponent powered case (MPC) first component (C1) first module according to various embodiments.
Figure 5A:
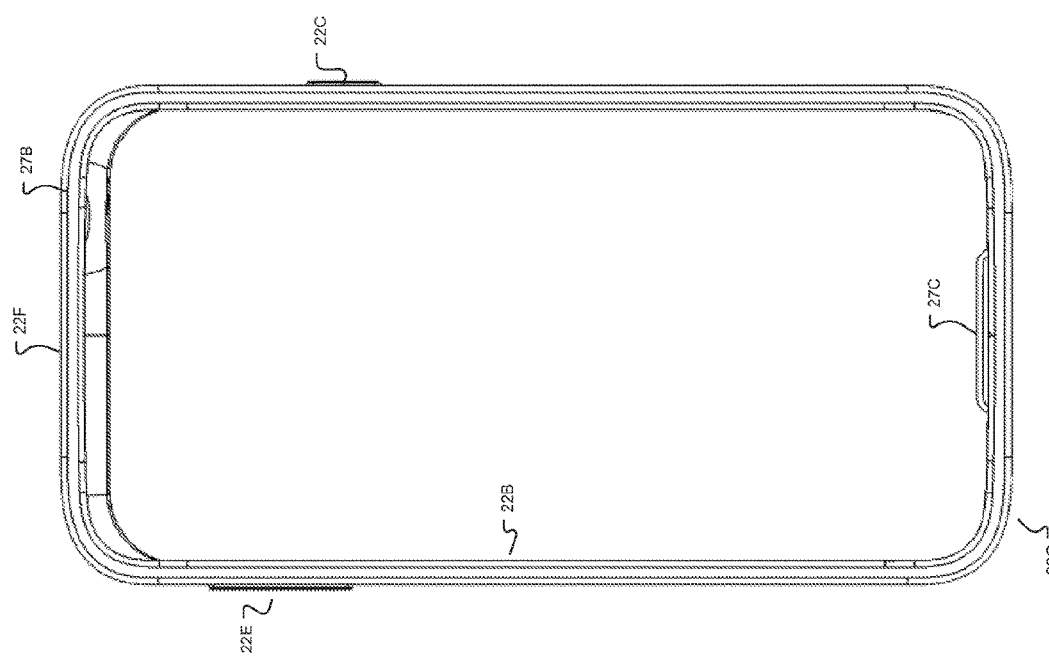
FIG. 5A is a simplified front diagram of a multicomponent powered case (MPC) first component (C1) first module according to various embodiments.

FIG. 5A is a simplified front diagram and FIG. 5B is a simplified rear diagram of a multicomponent powered case (MPC) 5A first component (C1) 20A first module 22A according to various embodiments. FIG. 5C is a simplified left side diagram and FIG. 5D is a simplified right side diagram of a multicomponent powered case (MPC) 5A first component (C1) 20A first module 22A according to various embodiments. FIG. 5E is a simplified top diagram and FIG. 5F is a simplified bottom diagram of a multicomponent powered case (MPC) 5A first component (C1) first module 22A according to various embodiments. As shown in FIGS. 5A-5F, the module 22A may include a right rail opening 22D, a left rail opening 22D, a top section 22F, a bottom section 22G, and a device openings 27A, 27B, and 27C.

FIG. 6A is a simplified front diagram and FIG. 6B is a simplified rear diagram of a multicomponent powered case (MPC) 5A first component (C1) 20A second module 28A according to various embodiments. FIG. 6C is a simplified left side diagram and FIG. 6D is a simplified right side diagram of a multicomponent powered case (MPC) 5A first component (C1) 20A second module 28A according to various embodiments. FIG. 6E is a simplified top diagram and FIG. 6F is a simplified bottom diagram of a multicomponent powered case (MPC) 5A first component (C1) second module 28A according to various embodiments. As shown in FIGS. 6A-6F, the module 28A may include a right rail indentation or insert 24A, a left rail indentation or insert 24B, a right side 28I, a left side 28H, and inner, back 28F, and outer, back 28G, and device openings 29A, 29B, and 29C.

Figure 7A:
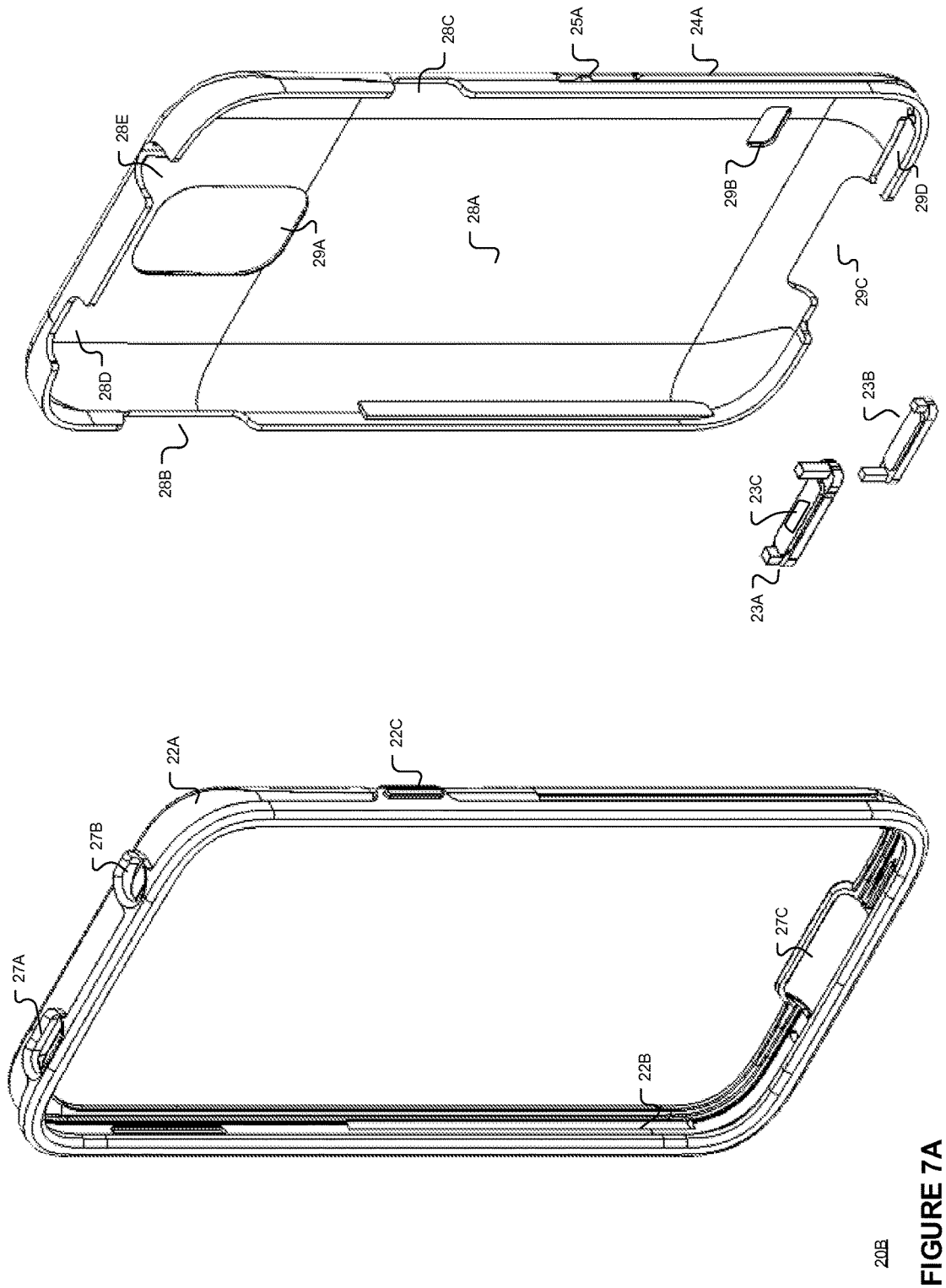
FIG. 7A is a simplified, expanded, isometric diagram of another multicomponent powered case (MPC) first component (C1) modules according to various embodiments.

FIG. 7A is a simplified, expanded, isometric diagram of a multicomponent powered case (MPC) 5B first component (C1) 20B modules 22A and 28A according to various embodiments. As shown in FIG. 7A, the C1 20B module 22A may include a front lip 22B, a first electronic device button extension 22C, a rear extension 22H, an upper, left opening 27A, an upper, right opening 27B, and a lower, middle opening 27C. The C1 20B module 28A may include a left side upper, button opening 28B, a right side, upper button opening 28C, rail depression 24A, rail extension 25A, upper rear opening 29A in the inner back 28F, lower, right opening 29B, bottom middle opening 29C, bottom right opening 29D, first nestable cover section 23A and second nestable cover section 23B. The first cover section 23A may be sized and shaped to engage the openings 29C and 27C. The second cover section 23B may be sized and shaped to engage the opening 29D. The module 22A rear extension 22H may conform and engage the module 28A outer back 28G. The first nestable cover section 23A may include an opening 23C sized to enable the electronic interface connector 13A to pass into an electronic device 30A connector 32G.

FIG. 7B is a simplified rear diagram of architecture 100B including a multicomponent powered case (MPC) 5B with a first component (C1) 20B coupled to an electronic device 30A and fully advanced and coupled with a second, powered component (C2) 10B according to various embodiments. As shown in FIG. 7B, the C2 10B has a plurality of openings or fenestrations 17A and 17B that may correspond to one or more electronic device 30A components including a camera 32B and a near field communication module 32C. As also shown in FIG. 7B, the second component 10B may include a power module 110B. As shown in FIG. 7B and FIG. 8B, the power module 110B may include an electrical energy storage module 16A, a control module 16B, a user control-display module 16C, an inductive charging module 16D, an external power interface 16E, and an electronic device interface 16F. The power module 110B may provide power to an electronic device 30A via induction (via the induction module 16D) or the electronic device interface 16F. The power module 110B may receive electrical energy via induction (the induction module 16D) or directly via the external power interface module 16E.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion. The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A multicomponent apparatus for providing power and device perimeter protection for a portable handheld mobile device (PHMD) apparatus including a power coupling interface and an outer perimeter, the multicomponent apparatus including:
   a perimeter protection module (PPM), the perimeter protection module including a frame including at least a bottom, left, and right side forming an opening that when coupled to a PHMD engages at least 60% of the PHMD perimeter, the outer left side including one of an elongated rail and slot along at least a portion thereof and the outer right side including one of an elongated rail and slot along at least a portion thereof; and a power source module (PSM), the power source module including:
   a shell, the shell including an elongated surface with an elongated left shoulder and an elongated right shoulder on opposite sides of the surface, the inside surface of the left shoulder including the other of an elongated slot and rail sized to engage at least a portion of the PPM outer left side one of an elongated rail and slot and the inside surface of the right shoulder including the other of an elongated slot and rail sized to engage at least a portion of the PPM outer right side one of an elongated rail and slot;
   an electrical energy storage module (EESM), the EESM storing and discharging electrical energy and sized to fit with the PSM elongated surface;
   an input electrical energy interface (IEEI) configured to receive electrical energy from an external power source;
   an output electrical energy interface (OEEI) configured to provide electrical energy to the PHMD power coupling interface; and
   a control module sized to fit substantially within the PSM shell and providing electrical energy to the OEEI from one of the EESM and the IEEI.

2. The multicomponent apparatus of claim 1, wherein the control module includes a printed circuit board sized to substantially fit within the PSM shell.

3. The multicomponent apparatus of claim 1, wherein the respective rails have a shaped protrusion in cross section and the mating slots have a protrusion shaped relief in cross section.

4. The multicomponent apparatus of claim 1, wherein the respective rails have a dove tail shaped protrusion in cross section and the mating slots have a dove tail recess in cross section.

5. The multicomponent apparatus of claim 1, wherein the respective rails have an at least semicircular shaped protrusion in cross section and the mating slots have an at least semicircular shaped relief in cross section.

6. The multicomponent apparatus of claim 1, wherein a respective rail has at least one of a protrusion and recess and a mating slot have at least one of a recess and protrusion located to engage the respective rail other of a protrusion and recess when the PPM is substantially seated within the PSM.

7. The multicomponent apparatus of claim 1, wherein each respective rail has at least one of a protrusion and recess and each mating slot has at least one of a recess and protrusion located to engage the respective rail other of a protrusion and recess when the PPM is substantially seated within the PSM.

8. The multicomponent apparatus of claim 1, wherein the PHMD perimeter includes four sides and wherein the PPM includes a section sized and shaped to securely engage at least three of four sides of the PHMD perimeter.

9. The multicomponent apparatus of claim 8, wherein the PPM includes a molded extension module and the molded extension modules includes a perimeter sized and shaped to securely engage the four sides of the one of the plurality of PHMD perimeter.

10. The multicomponent apparatus of claim 9, wherein the molded extension module perimeter is at least partially deformable.

11. The multicomponent apparatus of claim 10, wherein the molded extension module is formed of at least partially flexible material.

12. The multicomponent apparatus of claim 9, wherein the PPM further includes a rear section coupled to the extension module, the rear section sized to substantially conform to at least 60 percent of the PHMD rear section.

13. The multicomponent apparatus of claim 12, wherein the molded extension module is formed of at least partially flexible material and the rear section is formed of substantially rigid material.

14. The multicomponent apparatus of claim 1, wherein the PHMD is a mobile phone.

15. The multicomponent apparatus of claim 1, wherein the OEEI is a standardized electrical connector.

16. The multicomponent apparatus of claim 15, wherein the IEEI is a standardized electrical connector.

17. The multicomponent apparatus of claim 1, wherein the OEEI provides electrical energy inductively.

18. The multicomponent apparatus of claim 1, wherein the IEEI receives electrical energy inductively.

* * * * *